US008754676B2

(12) United States Patent
Sprentall

(10) Patent No.: US 8,754,676 B2
(45) Date of Patent: Jun. 17, 2014

(54) DIRECT DRIVE WAVEFORM AMPLIFIER

(71) Applicant: Rogers Corporation, Rogers, CT (US)

(72) Inventor: Karl Edward Sprentall, Scottsdale, AZ (US)

(73) Assignee: Rogers Corporation, Rogers, CT (US)

( * ) Notice: Subject to any disclaimer, the term of this patent is extended or adjusted under 35 U.S.C. 154(b) by 0 days.

(21) Appl. No.: 13/836,641

(22) Filed: Mar. 15, 2013

(65) Prior Publication Data

US 2013/0200871 A1   Aug. 8, 2013

Related U.S. Application Data

(63) Continuation-in-part of application No. 13/134,559, filed on Jun. 10, 2011, now Pat. No. 8,536,906.

(60) Provisional application No. 61/759,640, filed on Feb. 1, 2013.

(51) Int. Cl.
*H03B 1/00* (2006.01)
*H03K 3/00* (2006.01)
*H02M 3/158* (2006.01)
*H03F 3/24* (2006.01)
*G06F 1/10* (2006.01)

(52) U.S. Cl.
CPC ............... *H02M 3/158* (2013.01); *H03F 3/245* (2013.01); *G06F 1/10* (2013.01)
USPC ........... 327/109; 327/108; 327/110; 327/111; 327/112; 327/291; 327/295; 327/299

(58) Field of Classification Search
CPC ........... H03F 3/245; H02M 3/158; G06F 1/10
USPC .................. 327/108, 109, 110, 291, 295, 299
See application file for complete search history.

(56) References Cited

U.S. PATENT DOCUMENTS

| 2004/0124889 A1* | 7/2004 | Koharagi et al. | 327/108 |
| 2008/0186004 A1* | 8/2008 | Williams | 323/282 |
| 2008/0218145 A1* | 9/2008 | Xu | 323/288 |
| 2009/0010035 A1* | 1/2009 | Williams | 363/131 |
| 2012/0256610 A1* | 10/2012 | D'Angelo | 323/284 |

* cited by examiner

*Primary Examiner* — John Poos
(74) *Attorney, Agent, or Firm* — Cantor Colburn LLP

(57) ABSTRACT

A high voltage waveform is generated that is similar to a low voltage input waveform. The high voltage waveform is a series of pulses that are applied directly to the device. An error signal controls the frequency, magnitude, and duration of the pulses. A feedback signal derived from the high voltage waveform is compared with the input waveform to produce the error signal.

26 Claims, 10 Drawing Sheets

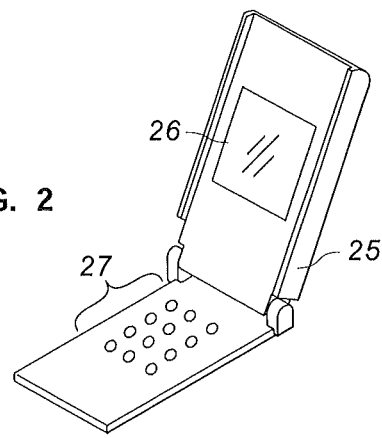
F I G. 2
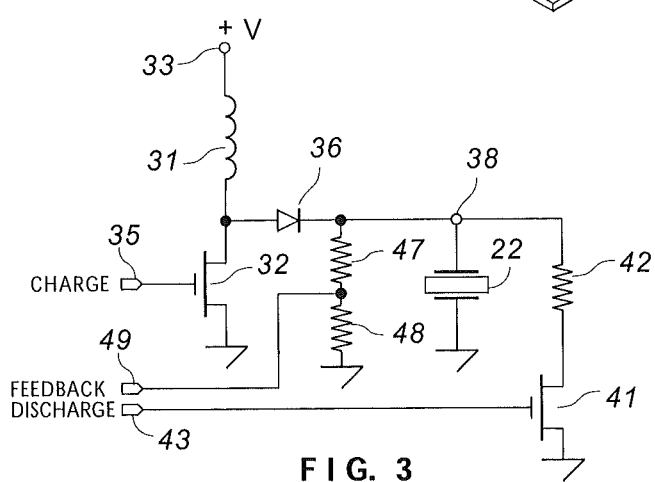
F I G. 3

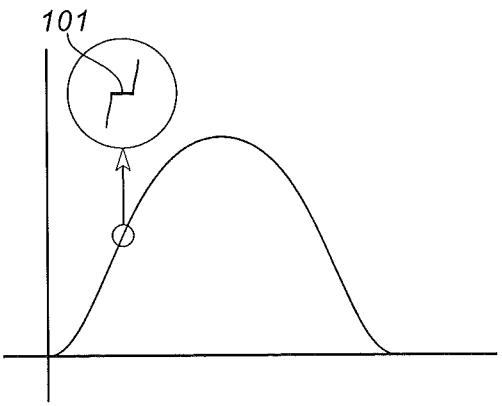
F I G. 10
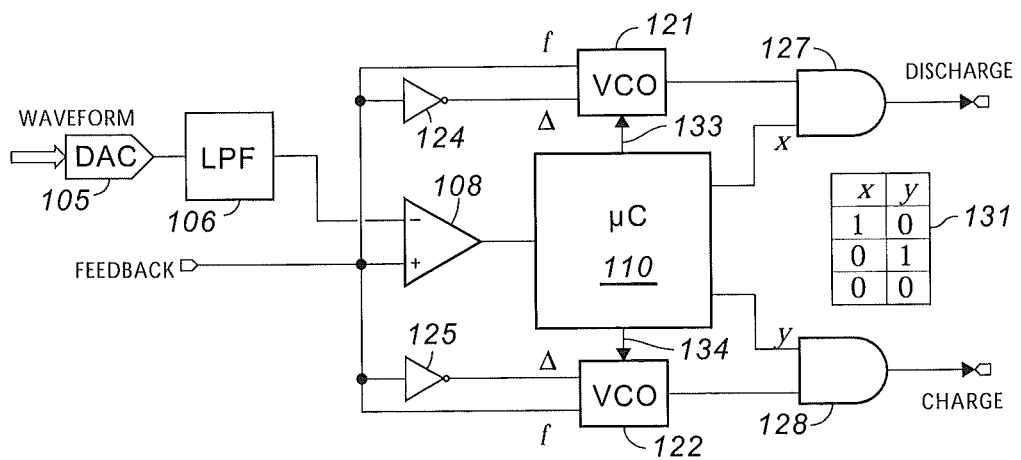
F I G. 11

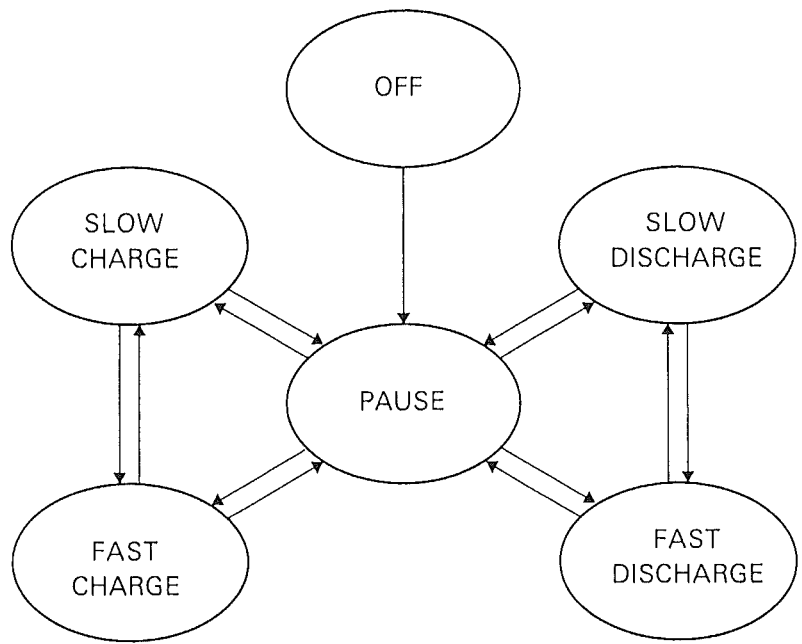

FIG. 12

| Current State | Transition Condition | Next State |
|---|---|---|
| Off | Enable = High | Pause |
| Pause | New A/D conversion complete output low, comparator low | Slow Charge |
| Pause | New A/D conversion complete output high, comparator low | Fast Charge |
| Pause | New A/D conversion complete output low, comparator high | Fast Dischage |
| Pause | New A/D conversion complete output high, comparator high | Slow Discharge |
| Pause | No new A/D conversion, comparator event | Previous State |
| Slow Charge | Comparator event | Pause |
| Slow Charge | New A/D conversion complete output high | Fast Charge |
| Slow Charge | New A/D conversion complete, output low | Slow Charge |
| Fast Charge | Comparator event | Pause |
| Fast Charge | New A/D conversion complete output high | Fast Charge |
| Fast Charge | New A/D conversion complete, output low | Slow Charge |
| Slow Discharge | Comparator event | Pause |
| Slow Discharge | New A/D conversion complete output high | Slow Discharge |
| Slow Discharge | New A/D conversion complete, output low | Fast Discharge |
| Fast Discharge | Comparator event | Pause |
| Fast Discharge | New A/D conversion complete output high | Slow Discharge |
| Fast Discharge | New A/D conversion complete, output low | Fast Discharge |

FIG. 13

DIRECT DRIVE WAVEFORM AMPLIFIER

CROSS-REFERENCE TO RELATED APPLICATIONS

This application is a continuation-in-part of U.S. Non-Provisional Application Ser. No. 13/134,599, entitled "DIRECT DRIVE WAVEFORM GENERATOR," filed Jun. 10, 2011, which is incorporated herein by reference in its entirety. This application claims priority to U.S. Provisional Patent Application Ser. No. 61/759,640, filed Feb. 1, 2013, which is incorporated herein by reference in its entirety.

BACKGROUND

This invention relates to an amplifier and, in particular, to an amplifier that drives a device by creating a high voltage waveform similar to a low voltage control signal and applying the waveform directly to the device.

A piezoelectric actuator requires high voltage, greater than typical battery voltages of 1.5 to 12.6 volts. A "high" voltage is 20-200 volts, with 100-120 volts currently being a typical drive voltage. Some line driven power supplies for actuators provide as much as 1000 volts. Producing high voltage from a battery is more difficult than producing high voltage from a power line.

A voltage boost converter can be used to convert the low voltage from a battery to a higher voltage for the driver. In a boost converter, the energy stored in an inductor is supplied to a capacitor as pulses of current at high voltage.

FIG. 1 is a schematic of a circuit including a known boost converter; e.g. see U.S. Pat. No. 3,913,000 (Cardwell, Jr.) or U.S. Pat. No. 4,527,096 (Kindlmann). Inductor 11 and transistor 12 are connected in series between supply 13 and ground or common. When transistor 12 turns on (conducts), current flows through inductor 11, storing energy in the magnetic field generated by the inductor. Current through inductor 11 increases quickly, depending upon battery voltage, inductance, internal resistances, and the on-resistance of transistor 12. When transistor 12 shuts off, the magnetic field collapses at a rate determined by the turn-off characteristic of transistor 12. The rate of collapse is quite rapid, much more rapid than the rate at which the field increases. The voltage across inductor 11 is proportional to the rate at which the field collapses. Voltages of one hundred volts or more are possible. Thus, a low voltage is converted into a high voltage by the boost converter.

When transistor 12 shuts off, the voltage at junction 15 is substantially higher than the voltage on capacitor 14 and current flows through diode 16, which is forward biased. Each pulse of current charges capacitor 14 a little and the charge on the capacitor increases incrementally. At some point, the voltage on capacitor 14 will be greater than the supply voltage. Diode 16 prevents current from flowing to supply 13 from capacitor 14. The voltage on capacitor 14 is the supply voltage for other components, such as amplifier 21.

The output of amplifier 21 is coupled to piezoelectric actuator 22. The input to amplifier 21 can receive an alternating current signal, for bi-directional movement, or a direct current signal, for unidirectional movement or as half of a complementary drive (two amplifiers, one for each polarity, coupled to opposite terminals of piezoelectric actuator 22). In a complementary drive, the absolute magnitudes of the boosted voltages are greater than the absolute magnitude of the battery voltage. A complementary drive can use half the high voltage (or be provided with twice the high voltage) of a single drive but may require two boost converters.

It is known in the art to generate low voltage waveforms from pulse width modulated (PWM) signals; e.g. see U.S. Pat. No. 4,914,396 (Berthiaume), U.S. Pat. No. 5,703,473 (Phillips et al.), and U.S. Pat. No. 5,994,973 (Toki). Dealing with high voltages makes difficult, and more expensive, manufacturing devices that must isolate and control such voltages. A high voltage amplifier introduces losses that further reduce efficiency. The storage capacitor takes up valuable board space and the design of the driver illustrated in FIG. 1 is not readily adapted to different applications.

As used herein, "similar" in waveform does not mean an exact replica but a close approximation.

In view of the foregoing, one embodiment of the present invention eliminates the storage capacitor in a haptic driver.

SUMMARY OF THE INVENTION

The foregoing objects are achieved in this invention in which a high voltage waveform is generated that is similar to a low voltage input waveform. The high voltage waveform is a series of pulses that are applied directly to the device. An error signal controls the frequency, magnitude, and duration of the pulses. A feedback signal derived from the high voltage waveform is compared with the input waveform to produce the error signal.

According to one embodiment, a direct drive waveform generator for driving a load includes an inductive boost circuit coupled to an output terminal and having a charge control input, a discharge circuit coupled to the output terminal and having a discharge control input and a feedback circuit coupled to the output terminal. The generator also includes a control circuit having an input coupled to the feedback circuit, a waveform input, a first output coupled to the charge control input, and a second output coupled to the discharge control input. The control circuit produces pulse modulated signals on either the first output or the second output based at least partially on a signal received from the feedback circuit and a slope of a waveform supplied to the waveform input to generate a high voltage waveform proportional to the waveform.

According to another embodiment, a direct drive waveform generator for driving a load includes an inductive boost circuit coupled to an output terminal and having a charge control input, a discharge circuit coupled to the output terminal and having a discharge control input, and a feedback circuit having a feedback input, the feedback circuit including a capacitive device coupled between the feedback input and a reference voltage. The generator of this embodiment also includes a control circuit having an input coupled to the feedback circuit, a waveform input, a first output coupled to the charge control input, and a second output coupled to the discharge control input. The control circuit produces pulse modulated signals on either the first output or the second output based at least partially on a signal received from the feedback circuit to generate a high voltage waveform proportional to the waveform on the waveform input.

According to another embodiment, A direct drive waveform generator for driving a load includes an inductive boost circuit coupled to an output terminal and having a charge control input and a steering circuit coupled to the output terminal that connects the output terminal to a first steering output in a first mode of operation and to a second steering output in a second mode of operation. The generator also includes a first discharge circuit having a first discharge switch coupled to the first steering output and including a first control discharge input that controls operation of the first discharge switch and a second discharge circuit having a second discharge switch coupled to the second steering output and including a second discharge control input that controls operation of the second discharge switch. The generator further includes a feedback circuit that includes a first feedback circuit coupled to the first steering output and producing a first feedback signal, a second feedback circuit coupled to the second steering output and producing a second feedback signal, and a feedback selector coupled to the first and second feedback circuits having a feedback output and that couples either the first feedback signal or the second feedback signal to the feedback output based on the mode of operation. The generator also includes a control circuit having an input coupled to the feedback output, a waveform input, a charge output coupled to the charge control input, a first output coupled to the first discharge control input and a second output coupled to the second discharge control input. The control circuit produces pulse modulated signals on either the charge output or one of the first or second on a signal received from the feedback output and a waveform supplied to the waveform input to generate a high voltage waveform proportional to the waveform.

BRIEF DESCRIPTION OF THE DRAWINGS

A more complete understanding of the invention can be obtained by considering the following detailed description in conjunction with the accompanying drawings, in which:

FIG. 2 is a perspective view of an electronic device having a display and a keypad, either or both of which include a piezoelectric actuator;

FIG. 3 is a schematic of a boost circuit, constructed in accordance with the invention, coupled to a load;

FIG. 10 illustrates a detail of a generated waveform;

FIG. 11 is a block diagram of an alternative embodiment of the invention;

FIG. 12 is a state diagram of a system constructed in accordance with the invention;

FIG. 13 is a table showing how transitions occur among the several states;

DETAILED DESCRIPTION OF THE INVENTION

FIG. 2 illustrates electronic device 25 including display 26 and keypad 27. Either the display or the keypad, or both, can be provided with a piezoelectric device (not shown in FIG. 2) for providing tactile feedback when a key or a portion of the display is depressed slightly. Devices for providing feedback are known in the art. As described above, such devices can be single layer or have plural layers and be unidirectional or bi-directional.

Figure 1:
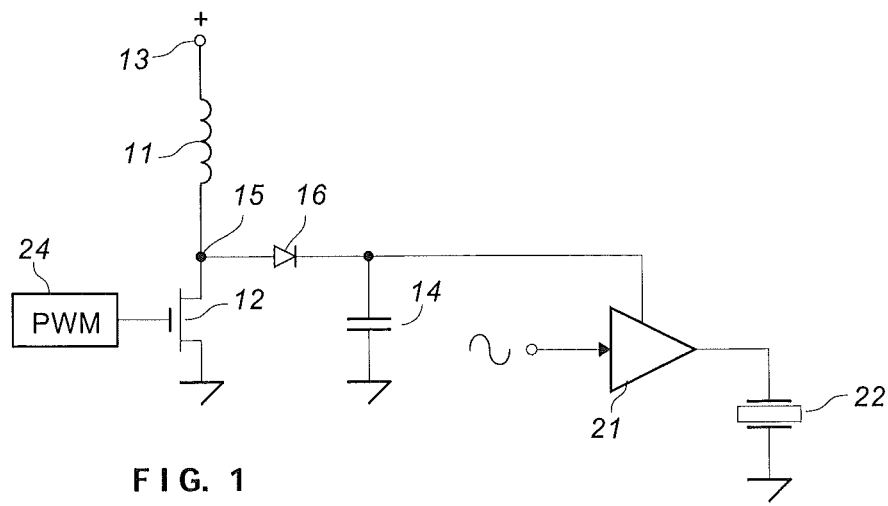
FIG. 1 is a schematic of a boost circuit, constructed in accordance with the prior art, coupled to a load.

FIG. 3 is a block diagram of one embodiment of a boost circuit that eliminates storage capacitor 14 (FIG. 1) and high voltage amplifier 21 (FIG. 1). The boost circuit includes inductor 31 and transistor 32 connected in series between supply 33 and ground or common. The control terminal of transistor 32 is coupled to CHARGE input 35. The junction of inductor 31 and transistor 32 is coupled by diode 36 to output terminal 38. A load, shown as a piezoelectric actuator, is coupled between output terminal 38 and ground. The circuit described thus far is a charging circuit for applying pulses to piezoelectric actuator 22 and may be referred to as a driver or boost converter in some instances. It shall be understood that while a piezoelectric actuator 22 is shown in FIG. 3 as the load, the teachings applied herein could be provided to any type of load. This includes, without limitation, a resistive, capacitive or inductive load.

The frequency, magnitude, and duration of the pulses is determined by the signal applied to CHARGE input 35. As described further below, an envelope of the pulses is proportional to an input or reference signal. The boost circuit shown in FIG. 3 has several control inputs that receive signals from a control circuit (see, e.g., FIGS. 4, 5 and 7). The combination of a boost circuit and a control circuit may be referred to as an amplifier herein. The ratio between the envelope and the input signal is the gain of such an amplifier.

Transistor 41 and resistor 42 are connected in series between output terminal 38 and ground. The control terminal of transistor 41 is coupled to DISCHARGE input 43. Transistor 41 and resistor 42 discharge any charge accumulated on piezoelectric actuator 22 and further contribute to the waveform applied to the device. When transistor 41 is conductive, the voltage at the output terminal 38 can be reduced to maintain its proportionality to the input signal.

Resistor 47 and resistor 48 are coupled in series between output terminal 38 and ground. The junction of resistor 47 and resistor 48 is coupled to FEEDBACK output 49. The resistors are a voltage divider, providing a fraction of the voltage between output terminal 38 and ground to FEEDBACK output 49. That fraction, referred to herein as an attenuation factor, $\epsilon$, is equal to $R_{48}/(R_{47}+R_{48})$. The feedback signal is used to produce the signals applied to the CHARGE and DISCHARGE inputs and, thus, the waveform of the voltage applied to piezoelectric actuator 22. The waveform can have any desired shape, e.g. continuous (sinusoidal) or discontinuous (ramp or pulse). It shall be understood that the attenuation factor is directly related to the gain of an amplifier including the boost circuit shown in FIG. 3.

Figure 6:
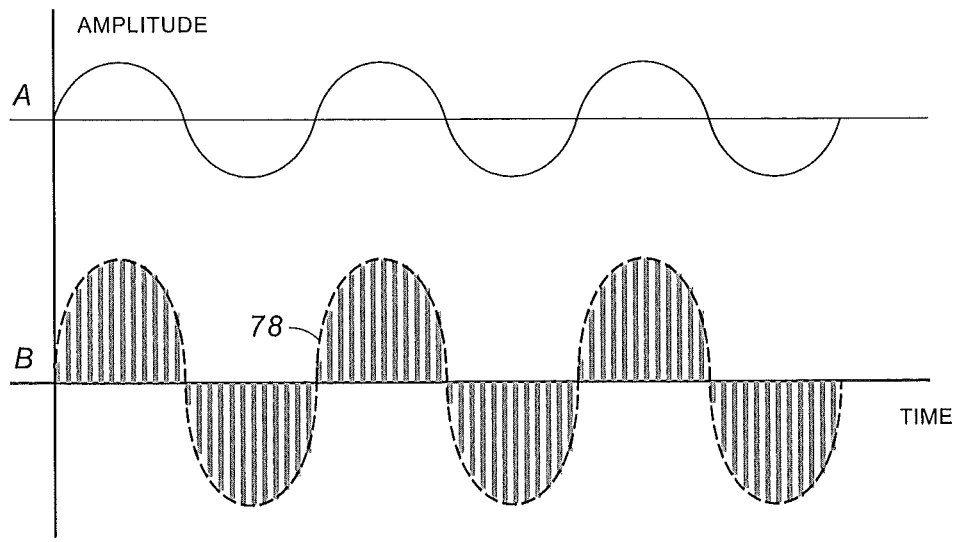
FIG. 6 is a chart illustrating the operation of an amplifier constructed in accordance with the invention.

The output "waveform" refers to the envelope of the signal applied to output terminal 38; see FIG. 6. The envelope is the result of a series of high frequency pulses of various magnitudes and widths. Because a piezoelectric device is capacitive, some smoothing occurs and the waveform can considered as though it did not comprise pulses.

Figure 4:
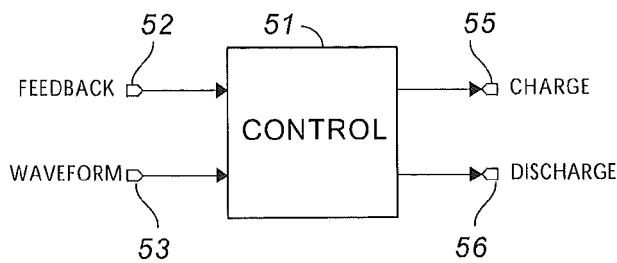
FIG. 4 is a block diagram of a control circuit for the boost circuit illustrated in FIG. 3.

FIG. 4 is a block diagram of a control circuit 51 for the boost circuit illustrated in FIG. 3. The control circuit 51 can be analog or digital and includes FEEDBACK input 52, which is coupled to FEEDBACK output 49 (FIG. 3), and WAVEFORM input 53. Input 53 corresponds to the input to amplifier 21 (FIG. 1) and may be referred to as the input or reference signal herein. The control circuit 51 includes CHARGE output 55, which is coupled to CHARGE input 35

(FIG. 3), and DISCHARGE output 56, which is coupled to discharge input 43 (FIG. 3). If the control circuit 51 is digital, the input signal, can be an analog signal, a table of time and voltage values, or a reference value.

Figure 5:
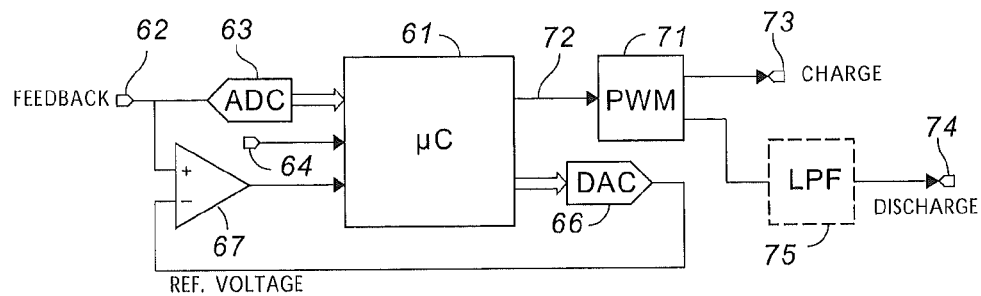
FIG. 5 is a block diagram of a digital control circuit for a boost circuit constructed in accordance with the invention.
Figure 7:
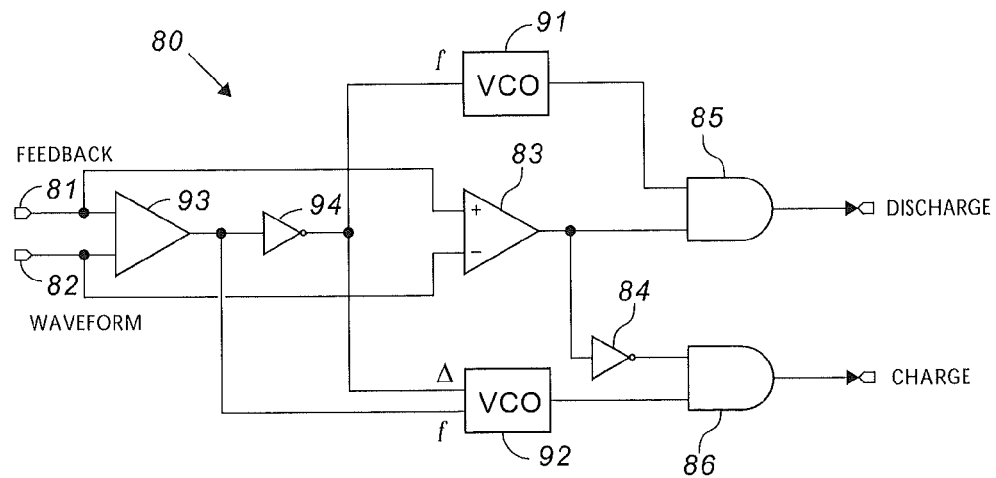
FIG. 7 is a block diagram of an analog control circuit for a boost circuit constructed in accordance with the invention.

FIGS. 5 and 7, respectively, illustrate examples of how the control circuit 51 of FIG. 4 may be implemented. In FIGS. 5 and 7, a triangle with plus (+) and minus (−) signs is a comparator; i.e. the output is digital (0 or 1). A triangle without plus (+) and minus (−) signs is a differential amplifier; i.e. the output is analog.

In FIG. 5, microcontroller 61 is coupled to FEEDBACK input 62 by analog to digital converter (ADC) 63. Input 64 to microcontroller 61 couples information describing the input signal to the microcontroller 61. The information can be analog or digital and describe the waveform itself or be data for selecting among waveforms previously programmed into microcontroller 61. Digital data describing the waveform is converted in digital to analog converter (DAC) 66 to produce a reference signal that is compared with the feedback signal in comparator 67. Comparator 67 provides an indication of which signal is greater and either the charge circuit or the discharge circuit is activated accordingly Pulse width modulator 71 is coupled to output 72 and has complementary outputs coupled to CHARGE output 73 and DISCHARGE output 74. Optionally, low pass filter 75 is coupled between pulse width modulator 71 and DISCHARGE output 74. Low pass filter 75 averages the pulses, slowing the discharge rate. It shall be realized that pulse width modulation is only one manner in which in which output pulses may be modulated. For instance, the pulse width modulator 71 could be a pulse frequency modulator (e.g., a voltage controlled oscillator) or a pulse train modulator.

Microcontroller 61 is a multi-state, finite state machine. The controller has two primary modes, charging and discharging. To improve accuracy, several sub-states are used in both the charging cycle and the discharging cycle. A piezo-electric device can be discharged more rapidly than it can be charged and this is accommodated in the machine states. Pseudo-code illustrating the machine states is in the Appendix at the end of this specification.

Comparator 67 provides rapid response to a change in feedback condition and, performs a one bit quantization of error. Error, $\delta$, is defined as the difference between the value of the feedback signal and the value of the reference signal. This difference is calculated in microcontroller 61 from the output of ADC 63 and the input to DAC 66. When error is defined in this manner, the ideal gain of the charge circuit is the inverse of the feedback attenuation factor, $\epsilon$. The comparator should have a response time ten to one hundred times faster than the sampling rate of ADC 63. The interrupt service routine associated with the comparator transition (see Appendix) serves as a pause state that will either return the program to the previous state in the event of another comparator transition or send the program to another state when the next analog to digital sample is completed.

The value of the error determines the next state of the finite state machine. Negative error means that the controller charges the load, positive means that the controller discharges the load. There are several states with various speeds of charging and discharging, corresponding to error ranges. In each of these states, the duty cycle of the pulse width modulator is preferably ramped up to the state's maximum duty cycle to ensure a smooth transition.

To charge the load, the boost circuit of FIG. 3 is switched in such a fashion that the input signal is multiplied by a gain factor and mimicked on the load. Up to the point of saturating an inductor, the energy stored in the inductor depends on the length of time that transistor 32 (FIG. 3) is conductive. When transistor 32 turns off, the output voltage is proportional to the rate at which the magnetic field collapses through the inductor. The more energy that is stored in the inductor, the higher the output voltage. Thus, on-time controls gain. In this manner a series of pulses of changing on-time have an envelope that mimics the input signal.

In one embodiment, to allow maximum accuracy of the output signal, the switching frequency of the charge or discharge inputs is at least one thousand times, and preferably several thousand times, the Nyquist frequency of the desired output signal to the load. In one embodiment of the invention, an output signal with a frequency of 300 Hz was generated with a charge frequency of 150 kHz.

If a signal is sampled at 32 kHz, any frequency components of the signal above 16 kHz (the Nyquist frequency) will cause aliasing when the signal is reproduced by a digital to analog converter. The Nyquist frequency is a minimum threshold for fidelity. Pure tones do not have harmonics. Square waves are rich in odd harmonics. If the desired output signal is a square wave, the Nyquist frequency is higher than for a pure tone of the same frequency. In FIG. 6, waveform A is the input waveform and waveform B is the output waveform on terminal 38 (FIG. 3). Twenty four pulses produce each cycle of envelope 78.

The arithmetic unit in microcontroller 61 should be able to make all control calculations within a single cycle of the signal from pulse width modulator 71, which is well within the capability of modern microcontrollers.

In FIG. 7, the control circuit 80 includes FEEDBACK input 81 and WAVEFORM input 82 coupled to comparator 83. The output of comparator 83 is coupled to one input of AND gate 86 and to inverter 84. The output of inverter 84 is coupled to one input of AND gate 86. Comparator 83 thus determines whether the charge circuit or the discharge circuit operates, while inverter 84 prevents simultaneous operation of both. If the feedback signal is greater than the waveform signal, the discharge circuit is operated. If the feedback signal is less than the waveform signal, the charge circuit is operated.

FEEDBACK input 81 and WAVEFORM input 82 are also coupled to differential amplifier 93, which generates a difference or error signal. The output of amplifier 93 is coupled to the frequency control input of voltage controlled oscillator (vco) 92 and to inverter 94. The output of inverter 94 is coupled to the frequency control input of vco 91 and to the duty cycle control input of vco 92. The output pulses from vco 91 are coupled to AND circuit 85. The output pulses from vco 92 are coupled to AND circuit 86.

Figure 8:
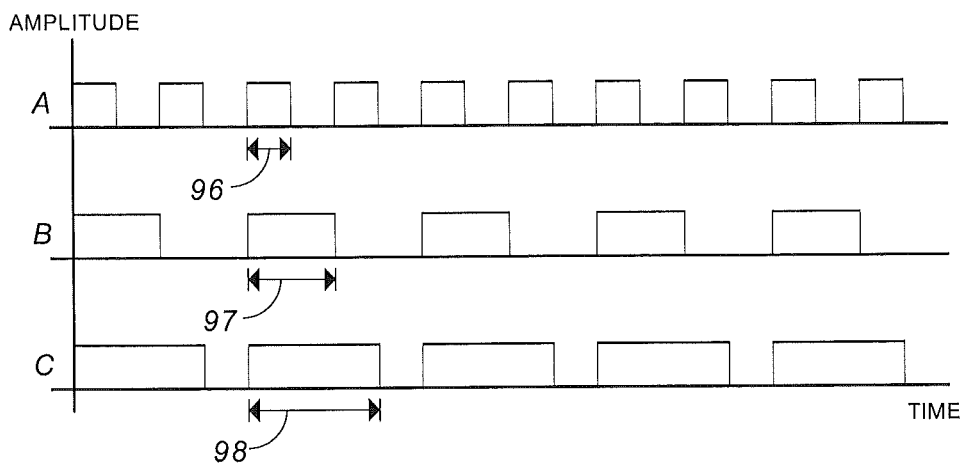
FIG. 8 is a chart illustrating the relationship between duty cycle, on-time, and frequency.

FIG. 8 is a chart illustrating the relationship between duty cycle, on-time, and frequency. For signal A, the pulses have a given frequency and a fifty percent duty cycle. On-time 96 is relatively short. For signal B, the pulses have a frequency half that of signal A and a fifty percent duty cycle. On-time 97 is twice as long as on-time 96. For signal C, the pulses have the same frequency as signal B but a duty cycle of seventy-five percent. On-time 98 is three times as long as on-time 96.

Because on-time determines the gain of the charging circuit, both frequency and duty cycle are varied to assure sufficient gain to create peaks in a sinusoidal signal. Also, gain is increased when the error (difference) signal from amplifier 93 is large in magnitude. Specifically, duty cycle is increased for large error and frequency is decreased for large error. Change in the opposite sense is provided by inverter 94.

Figure 9:
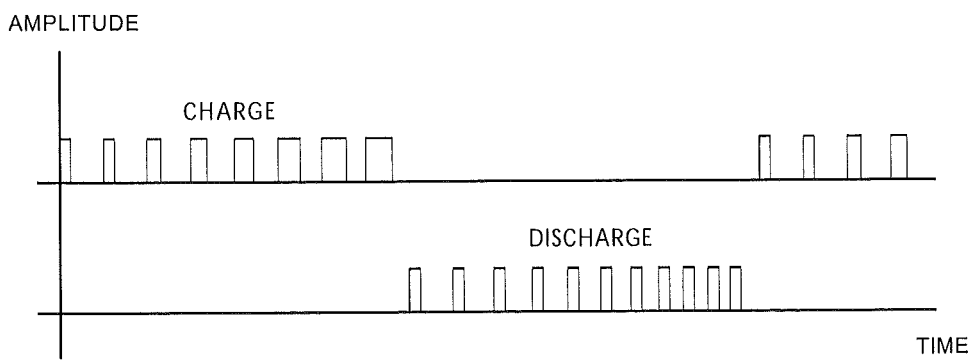
FIG. 9 is a chart illustrating the operation of an amplifier constructed in accordance with the invention.

FIG. 9 is a chart illustrating the operation of a waveform generator constructed in accordance with the invention. During a charge cycle, preferably both frequency and duty cycle are varied in accordance with the error signal from difference amplifier 93 (FIG. 7). During a discharge cycle, the frequency increases as the load discharges.

FIG. 10 is a chart of a generated waveform. Enlarged area 101 illustrates a step in the waveform caused by discrete current pulses from the charging circuit. These steps may or may not be acceptable for all applications.

FIG. 11 is a block diagram of an alternative embodiment of a control circuit that provides more precise control over the generated waveform, thereby reducing the size of steps in the generated waveform. The WAVEFORM input can be an analog control signal or stored digital data representing the desired waveform. In the embodiment illustrated in FIG. 11, the WAVEFORM input is stored data that is converted to an analog signal in digital to analog converter 105 and smoothed or averaged in low pass filter 106. The output of low pass filter 106 is coupled to the inverting input of comparator 108. FEEDBACK input 109 is coupled to the positive input of comparator 108.

The output of comparator 108 is coupled to an A/D input of microcontroller 110, which monitors this input not only for magnitude and direction but also for transitions, i.e., changes of state (positive to negative or negative to positive). In one embodiment of the invention, this requires only two bits of information. An error signal is either positive, represented by 1, or negative, represented by 0 (zero). A magnitude signal is either low, represented by 0 (zero), or high, represented by 1. The assignment of either one or zero is arbitrary.

Somewhat similar to the embodiment illustrated in FIG. 7, FEEDBACK signal 109 is coupled to both the frequency input and duty cycle input of voltage controlled oscillators. Specifically, FEEDBACK signal 109 is coupled to the frequency input of voltage controlled oscillator 121 and to the frequency input of voltage controlled oscillator 122. FEEDBACK signal 109 is coupled through inverter 124 to the duty cycle input of voltage controlled oscillator 121 and through inverter 125 to the duty cycle input of voltage controlled oscillator 121. The output of voltage controlled oscillator 121 is coupled to one input of AND gate 127. The output of voltage controlled oscillator 122 is coupled to one input of AND gate 128. The x output of microcontroller 110 is coupled to a second input of AND gate 127. They output of microcontroller 110 is coupled to a second input of AND gate 128. The output signals control the AND gates as indicated in table 131. Either AND gate or neither AND gate may be enabled. When neither is enabled, the system is in a "pause" state.

Microcontroller 110 includes output 133, coupled to voltage controlled oscillator 121 and output 134, coupled to voltage controlled oscillator 122. Outputs 133 and 134 determine whether one or both inputs to the voltage controlled oscillators determine duty cycle, thereby determining whether charge (or discharge) is fast or slow.

FIG. 12 is a state diagram of a system constructed in accordance with the invention. FIG. 13 is a table showing how transitions occur among the several states. By combining two charging rates with two discharging rates, the desired output waveform can be produced with very small steps, if any.

The invention thus provides a direct drive waveform amplifier that eliminates the storage capacitor and high voltage amplifier used in prior art. The control circuitry uses low voltage components that are independent of high voltage circuitry. The amplifier can be easily scaled to support higher voltages and currents by changing external components.

Figure 14:
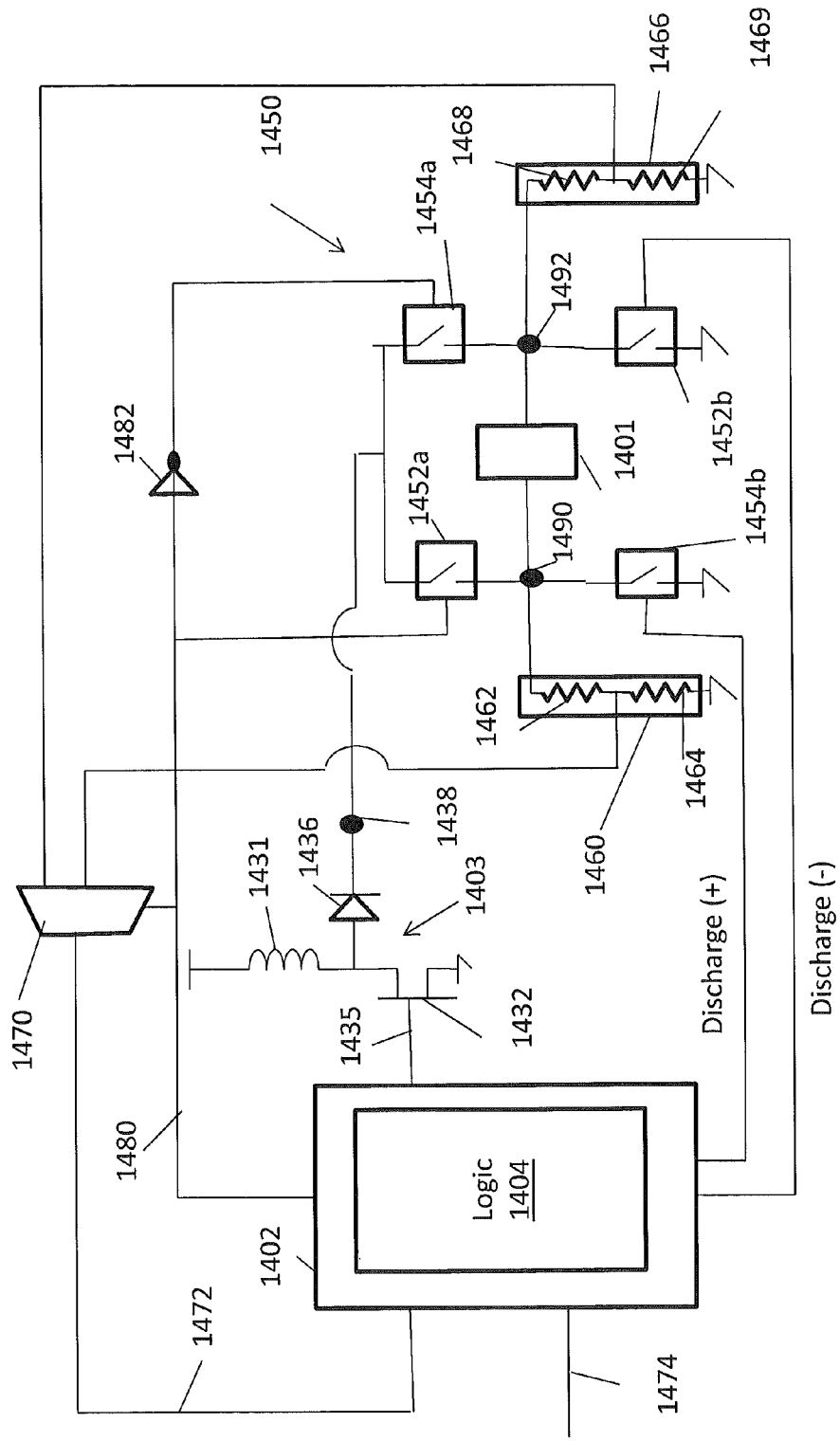
FIG. 14 is a schematic of an amplifier according to one embodiment that provides differential outputs.

While described and illustrated in conjunction with a single output terminal, the invention is readily adapted to providing high voltage waveforms on complementary or differential outputs. FIG. 14 illustrates an amplifier 1400 coupled to and driving a load 1401. The amplifier 1440 provides an amplified version to the input signal 1474 to the load 1401. In one embodiment, the load 1401 is a piezoelectric actuator. Of course, other types of loads could be driven. The illustrated amplifier includes a boost circuit 1403 and a control circuit 1402 that provides the boost circuit 1403 with a signal on its charge input 1435. In general, the signal provided on the charge input 1435 is created in the same or a similar manner as describe above.

Similar to the above, the boost circuit 1403 includes an inductor 1431 and transistor 1432 connected in series between supply 1433 and ground or common. The control terminal of the transistor 1432 is coupled to the charge input 1435. The junction of inductor 1431 and transistor 1432 is coupled by diode 1436 to output terminal 1438. Load 1401 is coupled between output terminal 1438 and ground. The circuit described thus far is a charging circuit for applying pulses to the load 1401. The frequency, magnitude, and duration of the pulses is determined by the signal applied to charge input 1435 in the same or a similar manner as is described above and is provided by control circuit 1402. The control circuit 1402 includes logic 1404 that provides the signal on the charge input 1435.

In contrast to the previously described embodiments, the load 1401 is driven by a differential signal. To that end, the amplifier also includes a steering circuit 1450 comprised of multiple switches 1452a and 1454a, or other current directing devices.

The steering circuit may operate in a first mode when the input signal is positive with respect to a common voltage and in a second mode when the input signal is negative with respect to that common voltage. In some cases the common voltage is zero, in others it is an offset value. In the first mode, switch 1452a is conductive and switch 1454a is not. As such, the voltage at node 1490 (referred to as the first steering output) is the same as that present at the output terminal 1438. In the second mode, switch 1452b is conductive and switch 1454b is not. As such, the voltage at node 1492 (referred to as the first steering output) is the same as that present at the output terminal 1438.

When the amplifier 1400 is connected to the load 1401 and operating in the first mode, the load 1401 is coupled to the output terminal 1438 and ground via switches 1452a and 1452b, respectively. In that first mode, switch 1454b operates to discharge the voltage at the output terminal 1438. This discharge can occur as described above or based at least partially on the slope of the reference signal 1474 as described more fully below. It shall be understood that the steering circuit 1450 may include one or more resistors (not shown) to control the discharge.

When the amplifier 1400 is connected to the load 1401 and operating in the second mode the load 1401 is coupled to the output terminal 1438 and ground via switches 1454a and 1454b, respectively. In this mode, switch 1452b operates to discharge the voltage at the output terminal 1438. This discharge can occur as described above or based at least partially on the slope of the reference signal 1474 as described more fully below.

It shall be understood that the switches 1452b and 1454b can operate as either part of the steering circuit to direct current through the load 1401 or can be used to discharge the load (i.e., form part of the discharge circuit). Accordingly, these switches 1454a and 1454b may be referred to herein as discharge switches from time to time herein.

When in the first mode, the first feedback circuit 1460 draws current from the output terminal 1438 through switch 1452a. As illustrated, the first feedback circuit 1460 includes resistor 1462 and resistor 1464 coupled in series between node 1490 and ground or a reference voltage. The junction of resistor 1462 and resistor 1464 is coupled to feedback selector 1470. As described above, the resistors 1462 and 1464 form a voltage divider that define the attenuation factor, $\epsilon$, by providing a fraction of the voltage between output terminal 1438 (e.g., at node 1490) and ground to the feedback selector 1470.

When in the second mode, the second feedback circuit 1466 draws current from the output terminal 1438 through switch 1454a. The second feedback circuit 1466 includes resistor 1468 and resistor 1469 coupled in series between node 1492 and ground. The junction of resistor 1468 and resistor 1469 is coupled to the feedback selector 1470 that selects whether between the signal at the junction of resistor 1462 and resistor 1464 and the junction of resistor 1468 and resistor 1469 as the feedback signal 1472 to provide as input to the controller 1402. As will be understood, the feedback selector 1470, while illustrated as a multiplexer, could be implemented in other manners such as, for example, one or more switches. As above, resistors 1468 and 1469 form a voltage divider that defines the attenuation factor, $\epsilon$, by providing a fraction of the voltage between output terminal 1438 and ground to the feedback selector 1470. In one embodiment, the value of resistor 1468 is greater than resistor 1469. As such, in some instances, resistor 1468 is a so called "high-voltage" resistor. The same may be true of resistor 1462 of the first feedback circuit 1460.

In the illustrated embodiment, the position of the switches 1452a and 1454a (open or closed) is controlled by value of an output signal 1480 provided by the controller 1402. In one embodiment, this signal has a 1 or 0 value that corresponds to whether the amplitude of the waveform signal 1474 is positive or negative. In another embodiment, the output signal 1480 provided by the controller 1402 has a logical 1 or 0 value that corresponds to whether the amplitude of the feedback signal 1472 is positive or negative. It shall be understood that an inverter 1482 may be provided to allow for the selection of whether switch 1452a or switch 1454a is operable based on the value of the output signal 1480. Of course, the control circuit 1402 could provide two different output signals (one the opposite of the other) instead. Which of the two possible feedback signals to select is based on the output signal 1480 in the illustrated embodiment.

The position of the discharge switches 1452b and 1454b is determined based on the logical values of discharge (+) and discharge (−), respectively. In general, discharge (−) is a logical 1 when the output signal 1480 is a logical 0 (i.e., input is negative) and the amplifier 1400 is discharging the load. Similarly, discharge (+) is a logical 1 when the output signal 1480 is a logical 1 (i.e., input is positive) and the amplifier 1400 is discharging the load.

Based on the above disclosure, one of ordinary skill will realize that situations may exist where a discharge occurs even while the amplitude of the input signal is increasing. Similarly, other situations may exist where a charge may occur when the amplitude of the input signal is decreasing. Such operation can be avoided, however, simply by considering the slope of the input signal 1474 as described below.

In a charging state, the charge pulse signal is applied to the control input of any of the boost circuits described herein. According to one embodiment, the charge signal may be gated by both the error signal and the slope signal. If the reference signal is greater than the attenuated output (e.g., the feedback signal) and the slope of the reference signal is positive, then the output is charged. Otherwise, the control input to the boost circuit is set such that the switch is in a high impedance mode (e.g., no pulses are provided to the load).

When the slope of the reference signal is negative, the amplifier is in a discharge state and a discharge pulse signal is applied to the control terminal of the discharge network as described above. In one embodiment, the discharge signal is gated by the slope and error values. For instance, if the reference signal is less than the feedback signal and the slope of the reference signal is negative, the discharge signal is applied as described above. Otherwise, the discharge network is maintained in a high impedance mode.

Figure 15:
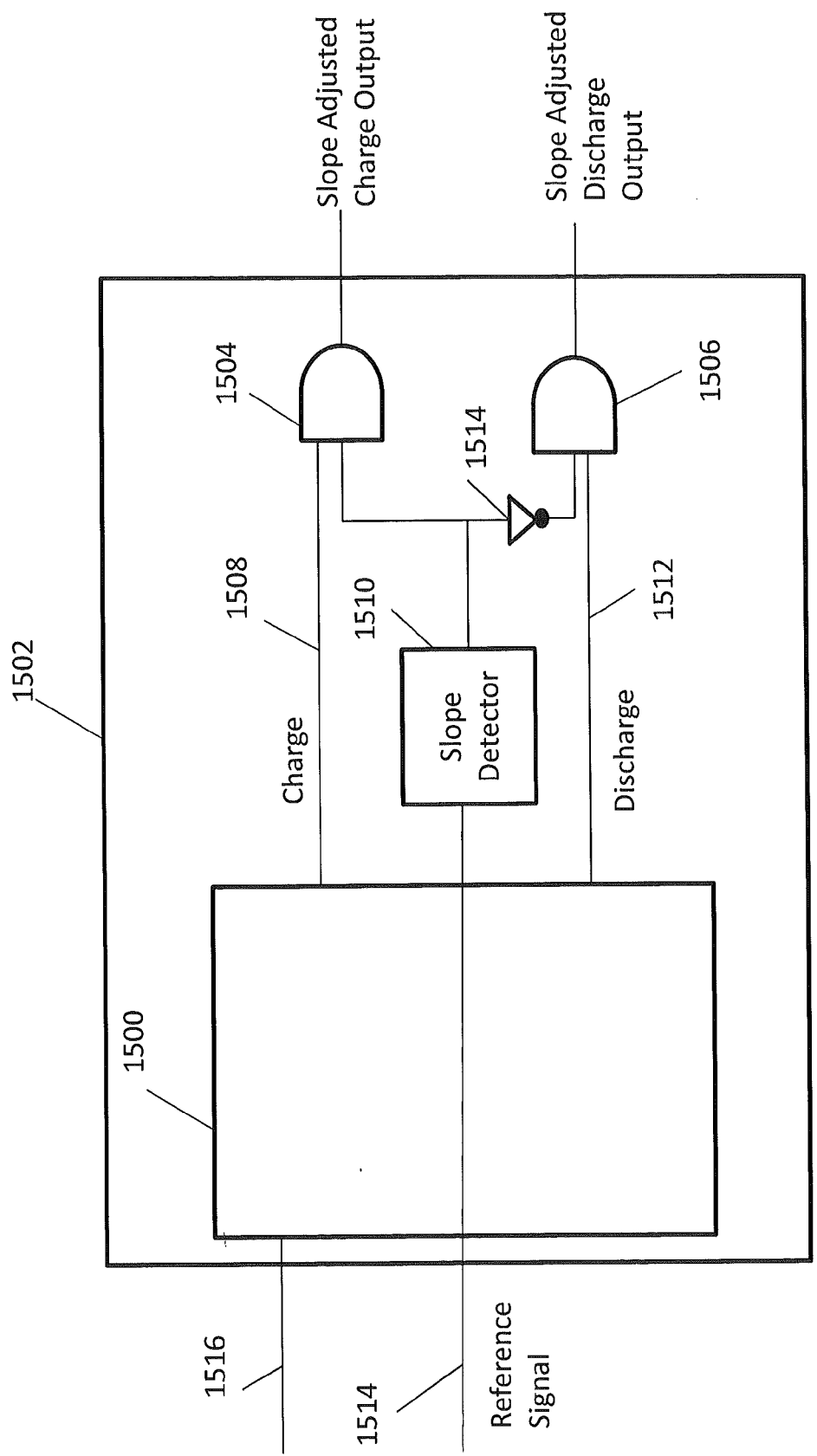
FIG. 15 is a schematic of logic that may be applied to a charge signal.

With reference now to FIG. 15, in all of the above control circuits charge and discharge outputs were provided. Each of these control circuits (generally denoted by reference numeral 1500 in FIG. 15) can include a logic gate (e.g., AND gates 1504 and 1506) that suppress the charge and discharge outputs based on a slope of the input. As previously described, the control circuit 1500 receives a reference signal 1514 and a feedback signal 1516. Based on these signals, charge 1508 and discharge 1512 signal can be formed by any of the control circuits described above. According to one embodiment, these charge 1508 and discharge 1510 signals are gated by the slope of the reference signal 1514. To that end, the illustrated slope based controller 1502 includes a control circuit and a slope detector 1510 that determines the slope of the reference signal 1514. In the illustrated embodiment, the slope detector 1510 provides a "1" when the slope of the reference is positive and a "0" when it is negative. The value output by the slope detector 1510 (or its opposite as formed by inverter 1514) will gate the charge 1508 and discharge 1512 circuits via AND gates 1504 and 1506, respectively, to produce slope adjusted charge and discharge outputs. These outputs can be applied as the charge and discharge inputs to any boost circuits disclosed herein.

Figure 16:
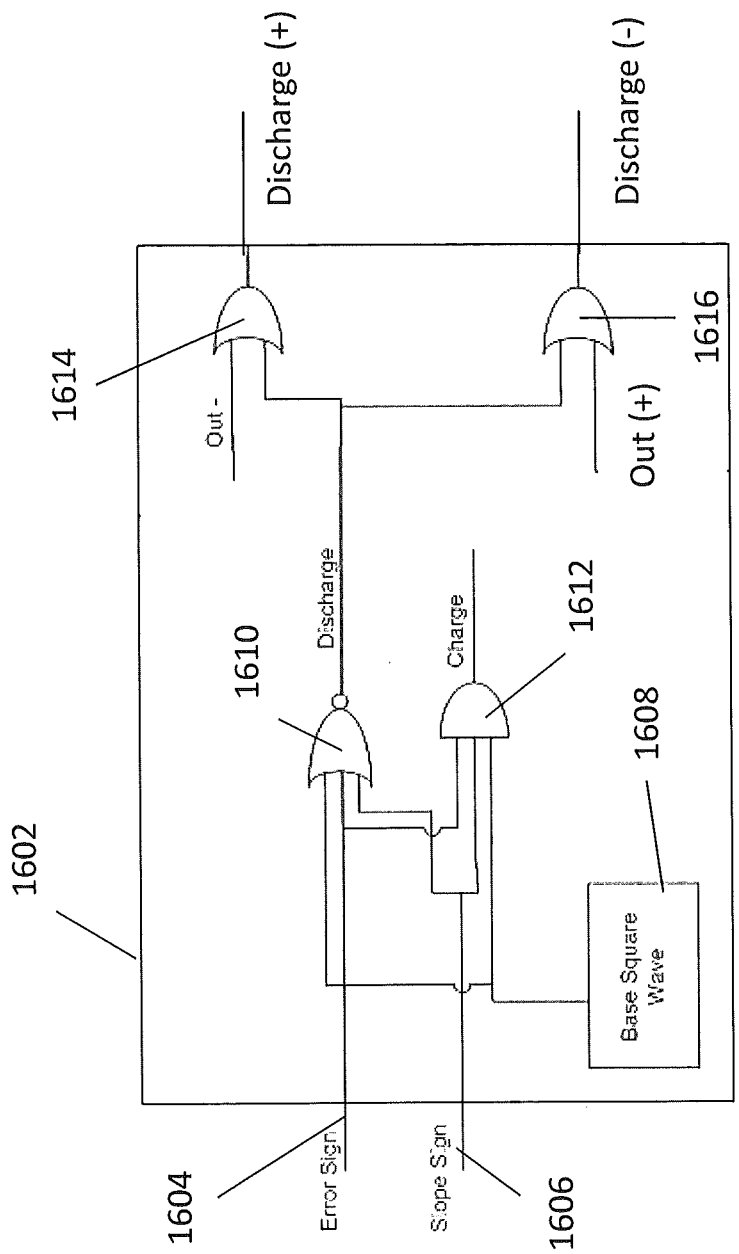
FIG. 16 is a schematic of logic that may be applied to a discharge charge signal.

In one embodiment, the slope adjusted discharge output can be modified to form the discharge (+) and discharge (−) outputs shown in FIG. 14. As described above, and with reference to FIGS. 14 and 16, when in the first mode, discharge (−) is always held. This may be accomplished by applying the discharge signal shown in FIG. 16 (output of NOR gate 1610) to an OR gate 1616 that also receives a signal that represents whether the input signal is positive (Out (+)). In this manner, regardless of the value of the discharge signal, one side of the load is always grounded. It will be understood that discharge (+) will follow the discharge signal while Out (+) is positive as it is formed by OR'ing the complement of Out (+) (Out (−)) with the discharge signal at OR gate 1614. Similarly, discharge (−) will follow the discharge while Out (−) is positive.

The logic that determines the value of the discharge signal is illustrated by an XOR gate 1610. This gate receives as inputs a base square wave 1608 that represents the pulse train formed as described above. It shall be understood that the frequency and duty cycle of the square wave can be varied depending on conditions. The square wave is then gated by the values of an error signal 1604 and the sign of slope 1610 of the input signal. The error signal 1604 is positive when the feedback signal exceeds the input signal. The base square wave 1608 will be suppressed when either the slope of the input signal is positive or the feedback signal exceeds the input signal, or both. AND gate 1612 is also coupled to error signal 1604, the sign of slope 1610 of the input signal and the base square wave 1608. In this manner, the charge signal is suppressed when either the slope of the input signal is negative or the feedback signal is less than the input signal, or both.

Figure 17:
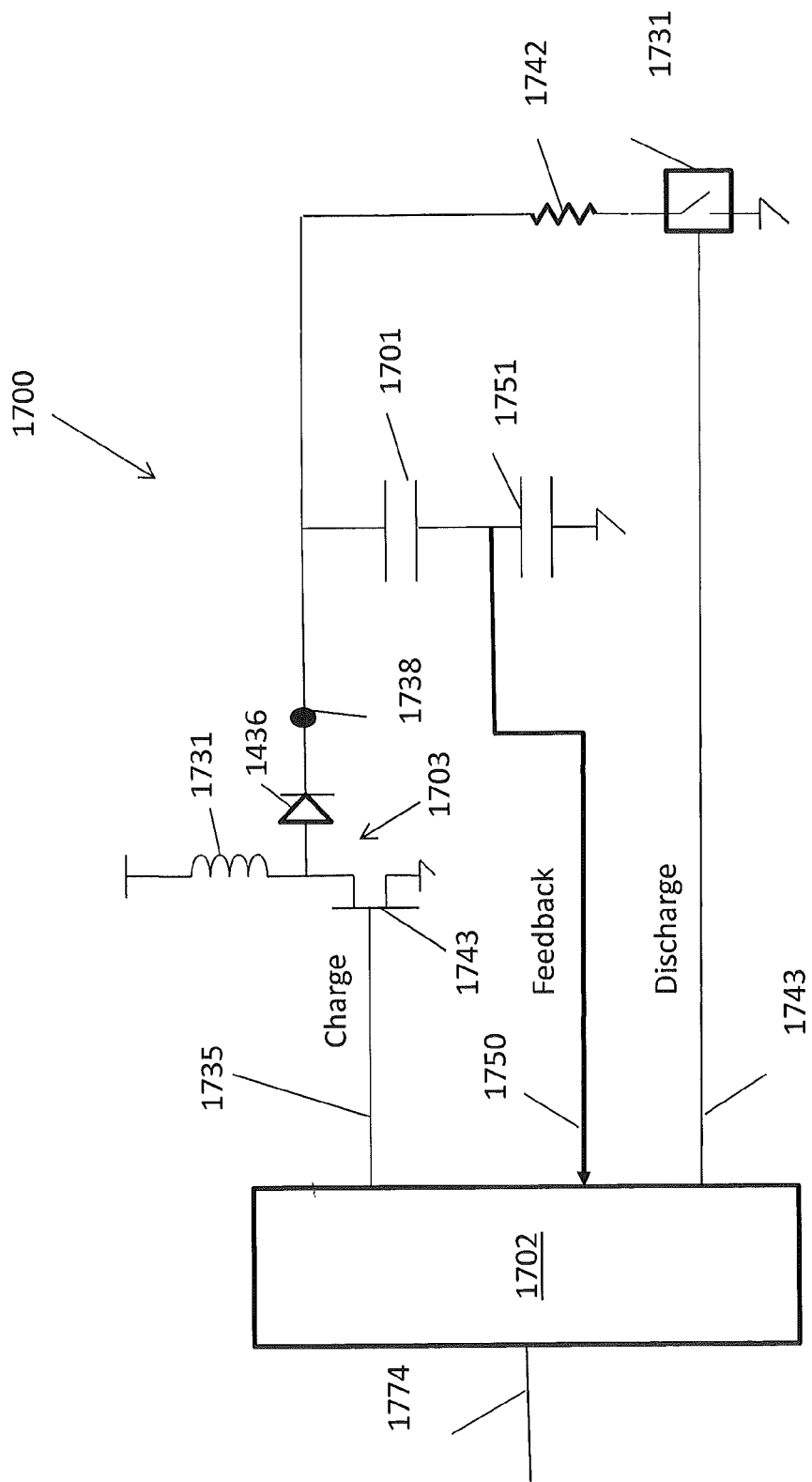
FIG. 17 is a schematic of an amplifier, constructed in accordance with one embodiment of the invention, coupled to a load.

FIG. 17 illustrates an amplifier 1700 coupled to and driving a load 1701. The amplifier 1700 provides an amplified version to the input signal 1774 to the load 1401. In one embodiment, the load 1701 illustrated is a piezoelectric actuator that includes capacitive characteristics.

The illustrated amplifier includes a boost circuit 1703 and a control circuit 1702 that provides the boost circuit 1703 with a signal on its charge input 1735. In general, the signal provided on the charge input 1735 is created in the same or a similar manner as described above. Of course, depending on the context, the charge input 1735 may or may not be gated by one or more the error value and the slope of the input signal 1774.

Similar to the above, the boost circuit 1703 includes an inductor 1731 and transistor 1732 connected in series between supply 1733 and ground or common. The control terminal of transistor 1732 is coupled to the charge input 1735. The junction of inductor 1731 and transistor 1732 is coupled by diode 1736 to output terminal 1738. The circuit described thus far is a charging circuit for applying pulses to the load 1701. The frequency, magnitude, and duration of the pulses is determined by the signal applied to charge input 1735 in the same or a similar manner as is described above and is provided by control circuit 1402. The control circuit 1402 includes logic 1404 that provides the signal on the charge input 1435.

The amplifier 1700 also includes transistor 1741 and resistor 1742 connected in series between output terminal 38 and ground. The control terminal of transistor 1741 is coupled to the discharge signal 1743 produced by the control circuit 1702. Transistor 1741 and resistor 1742 discharge any charge accumulated on load 1701 and further contribute to the waveform applied to the device. When transistor 1741 is conductive, the voltage at the output terminal 1738 can be reduced to maintain its proportionality to the input signal 1774.

In the prior examples, the feedback signal was taken from the voltage divider coupled between the output terminal 1738 and ground. In contrast, in FIG. 17 the feedback signal 1750 is taken from a location between the load 1701 and a feedback capacitor 1751. The load 1701 is illustrated as a capacitor and, in the case where the load is a piezoelectric actuator, has a capacitance defining impedance $Z_{load}$. A capacitive element, such as feedback capacitor 1751, has an impedance $Z_c$. In a similar manner as described above, $Z_c/(Z_{load}+Z_c)$ defines the attenuation factor, $\epsilon$, for the amplifier 1700. Feedback capacitor 1751 replaces the voltage divider that included two resistors, one of which was high-voltage, while still allowing the signal provided to the load to track the input signal.

Figure 18:
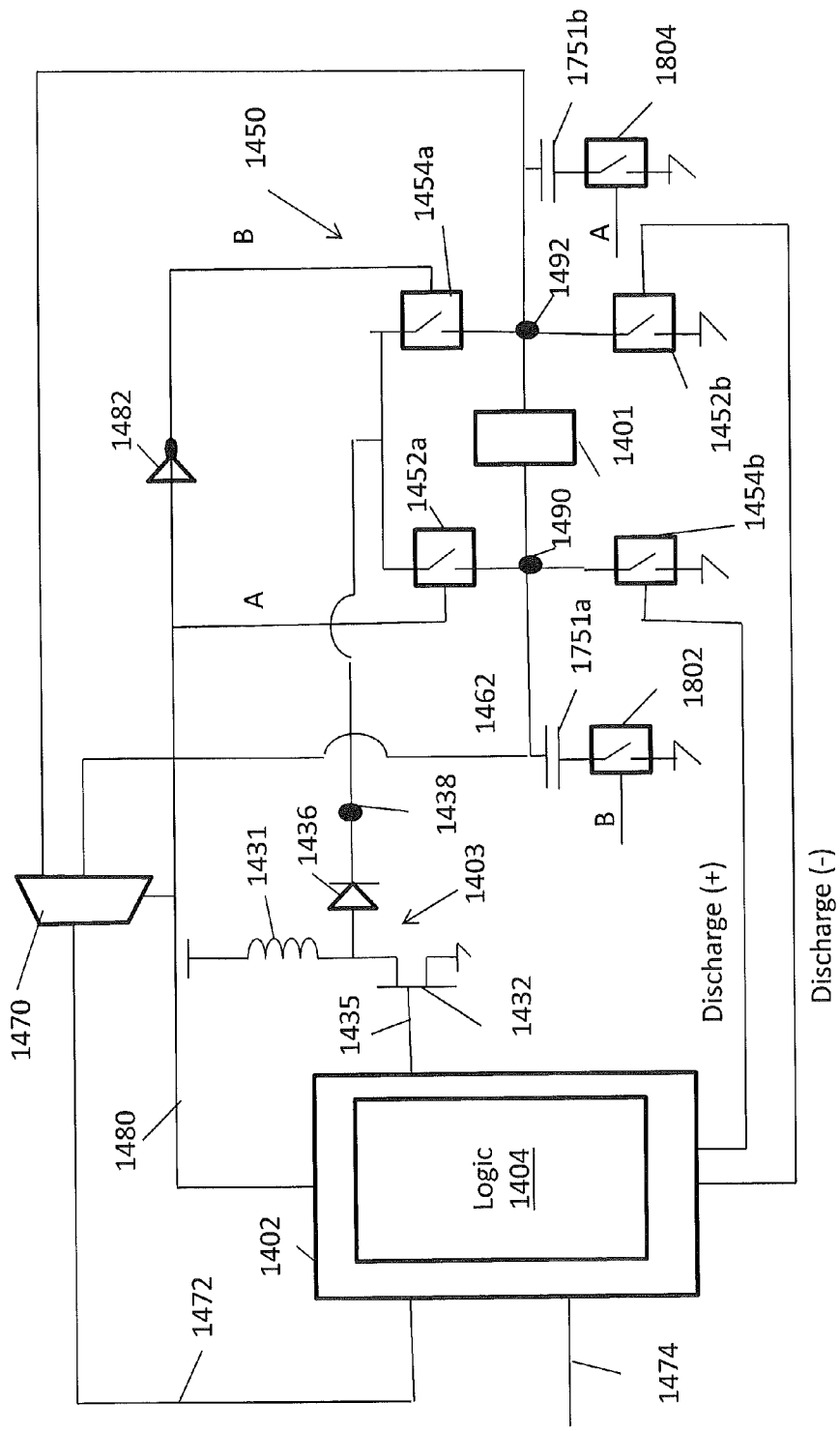
FIG. 18 schematic of an amplifier, constructed in accordance with the embodiment shown in FIG. 17 providing a differential drive signal coupled to an actuator.

The teachings related to FIG. 17 can also be applied to a differential output circuit as shown in FIG. 18. In particular, in contrast to the circuit shown in FIG. 14, the feedback circuits 1460 and 1466 have been replaced with feedback capacitors 1751a and 1751b, respectively, in FIG. 18. In FIG. 18, the output signal 1480 is shown as having a natural value (A) and an inverted value (B) that controls the position of switches 1452a and 1454a. The operation of these switches, as described above, varies based on the value (positive or negative) of the input signal (e.g., output signal 1480). As illustrated, the feedback capacitor 1751 is coupled between switch 1802 and the load 1401. When in the second mode, switch 1802 connects feedback capacitor 1751a to ground to create, in combination with the load 1401, an impedance divider that provides an attenuated feedback signal. Similarly, when in the second mode, switch 1804 connects feedback capacitor 1751b to ground to create, in combination with the load 1401, an impedance divider that provides an attenuated feedback signal. Both feedback signals are provided to selector 1470 that can be operated as described above except that the value provided to the selector will select the other of the feedback signal selected in the embodiment described in FIG. 14.

Having thus described the invention, it will be apparent to those of skill in the art that various modifications can be made within the scope of the invention. For example, functionally, it does not matter if the positions of transistor 41 and resistor 42 are reversed. Varying duty cycle may be omitted from the charge control in some applications. Although illustrated as external components, many microcontrollers have a plurality of ADC and DAC circuits on-board, eliminating the need for these devices as external components. More than two levels of charge or discharge can be used, depending upon application, with increasing number of states. The number of levels of charge can be fixed or programmable. For example, two input pins on a microcontroller can address one to four levels of charge, providing enhanced drive flexibility from a single implementation of the invention.

What is claimed is:

1. A direct drive waveform generator for driving a load, the generator comprising:
    an inductive boost circuit coupled to an output terminal and having a charge control input;
    a discharge circuit coupled to the output terminal and having a discharge control input;
    a feedback circuit coupled to the output terminal; and
    a control circuit having an input coupled to the feedback circuit, a waveform input, a first output coupled to the charge control input, and a second output coupled to the discharge control input;
    wherein the control circuit produces pulse modulated signals on either the first output or the second output based at least partially on a signal received from the feedback circuit and a slope of a waveform supplied to the waveform input to generate a high voltage waveform proportional to the waveform.

2. The direct drive waveform generator of claim 1, wherein the control circuit further includes a slope detector that determines if the slope of the waveform is positive or negative.

3. The direct drive waveform generator of claim 1, wherein pulses on the first output are suppressed when the slope of the waveform in negative.

4. The direct drive waveform generator of claim 1, wherein pulses on the second output are suppressed when the slope of the waveform in positive.

5. The direct drive waveform generator as set forth in claim 1, wherein the control circuit is digital.

6. The direct drive waveform generator as set forth in claim 5, wherein the control circuit includes a differential amplifier having one input coupled to the waveform input, one input coupled to the feedback input, and an output.

7. The direct drive waveform generator as set forth in claim 1, wherein the control circuit is analog.

8. The direct drive waveform generator as set forth in claim 7, wherein the control circuit includes a first voltage controlled oscillator coupled to the charge control input and a second voltage controlled oscillator coupled to the discharge control input.

9. A direct drive waveform generator for driving a load, the generator comprising:
    an inductive boost circuit coupled to an output terminal and having a charge control input;
    a discharge circuit coupled to the output terminal and having a discharge control input;
    a feedback circuit having a feedback input, the feedback circuit including a capacitive device coupled between the feedback input and a reference voltage; and a control circuit having an input coupled to the feedback circuit, a waveform input, a first output coupled to the charge control input, and a second output coupled to the discharge control input;
wherein the control circuit produces pulse modulated signals on either the first output or the second output based at least partially on a signal received from the feedback circuit to generate a high voltage waveform proportional to the waveform on the waveform input.

10. The direct drive waveform generator of claim 9, in combination with the load.

11. The direct drive waveform generator of claim 10, wherein the load is coupled between the output terminal and the feedback input.

12. The direct drive waveform generator of claim 9, wherein the load has a first impedance and the capacitive element has a second impedance that is less than the first impedance.

13. The direct drive waveform generator of claim 12, wherein the control circuit further includes a slope detector that determines if the slope of the waveform is positive or negative.

14. The direct drive waveform generator of claim 13, wherein pulses on the first output are suppressed when the slope of the waveform in negative.

15. The direct drive waveform generator of claim 13, wherein pulses on the second output are suppressed when the slope of the waveform in positive.

16. A direct drive waveform generator for driving a load, the generator comprising:
an inductive boost circuit coupled to an output terminal and having a charge control input;
a steering circuit coupled to the output terminal that connects the output terminal to a first steering output in a first mode of operation and to a second steering output in a second mode of operation;
a first discharge circuit having a first discharge switch coupled to the first steering output and including a first control discharge input that controls operation of the first discharge switch;
a second discharge circuit having a second discharge switch coupled to the second steering output and including a second discharge control input that controls operation of the second discharge switch;
a feedback circuit comprising:
a first feedback circuit coupled to the first steering output and producing a first feedback signal;
a second feedback circuit coupled to the second steering output and producing a second feedback signal; and
a feedback selector coupled to the first and second feedback circuits having a feedback output and that couples either the first feedback signal or the second feedback signal to the feedback output based on the mode of operation; and
a control circuit having an input coupled to the feedback output, a waveform input, a charge output coupled to the charge control input, a first output coupled to the first discharge control input and a second output coupled to the second discharge control input, the control circuit producing pulse modulated signals on either the charge output or one of the first or second on a signal received from the feedback output and a waveform supplied to the waveform input to generate a high voltage waveform proportional to the waveform.

17. The direct drive waveform generator of claim 16, wherein feedback selector couples the first feedback signal to the feedback output in the first mode and the second feedback signal to the feedback output in the second mode.

18. The direct drive waveform generator if claim 17, wherein the first feedback circuit includes at least two resistors coupled between the first steering output and a reference voltage and wherein the first feedback signal is formed at a node between the at least two resistors.

19. The direct drive waveform generator if claim 16, wherein feedback selector couples the first feedback signal to the feedback output in the second mode and the second feedback signal to the feedback output in the first mode.

20. The direct drive waveform generator if claim 19, wherein the first feedback selector includes a capacitive element coupled between the first steering output and a reference voltage wherein the first feedback signal is formed at an input to the first feedback circuit.

21. The direct drive waveform generator if claim 20, further comprising:
a capacitive load coupled between the first steering output and the second steering output.

22. The direct drive waveform generator if claim 16, wherein the control circuit produces a pulsed output on the second output and a constant output on the first output when the steering circuit is in the first mode and wherein the control circuit produces a constant output on the second output and a pulsed output on the first output when the steering circuit is in the second mode.

23. The direct drive waveform generator if claim 22, wherein the control circuit produces the pulsed output on the second output only when a slope of the waveform is negative and wherein the control circuit produces the pulsed output on the first output only when a slope of the waveform is increasing.

24. The direct drive waveform generator if claim 16, wherein the steering circuit is in the first mode of operation when in the waveform has a positive amplitude and in the second first mode of operation when in the waveform has a negative amplitude, wherein the amplitude of the waveform is measured from a common voltage.

25. A direct drive waveform generator comprising:
an inductive boost circuit coupled to an output terminal and having a charge control input;
a discharge circuit directly coupled to said output terminal and having a discharge control input;
a feedback circuit directly coupled to said output terminal; and
a control circuit having an input coupled to said feedback circuit, a waveform input, a first output coupled to said charge control input, and a second output coupled to said discharge control input;
wherein said control circuit produces pulse width modulated signals on either the first output or the second output to generate a high voltage waveform similar to the waveform on said waveform input.

26. The direct drive waveform generator as set forth in claim 25 wherein said control circuit is digital.

* * * * *